United States Patent
Milne et al.

(10) Patent No.: US 7,493,578 B1
(45) Date of Patent: Feb. 17, 2009

(54) CORRELATION OF DATA FROM DESIGN ANALYSIS TOOLS WITH DESIGN BLOCKS IN A HIGH-LEVEL MODELING SYSTEM

(75) Inventors: Roger B. Milne, Boulder, CO (US); Alexander R. Vogenthaler, Boulder, CO (US); Jeffrey D. Stroomer, Lafayette, CO (US); Bradley L. Taylor, Santa Cruz, CA (US); Alexander Carreira, Longmont, CO (US)

(73) Assignee: Xilinx, Inc., San Jose, CA (US)

( * ) Notice: Subject to any disclaimer, the term of this patent is extended or adjusted under 35 U.S.C. 154(b) by 457 days.

(21) Appl. No.: 11/083,667

(22) Filed: Mar. 18, 2005

(51) Int. Cl.
*G06F 17/50* (2006.01)
*G06F 11/00* (2006.01)

(52) U.S. Cl. .................. 716/5; 716/1; 716/2; 716/3; 716/4; 716/18; 703/13; 703/14; 703/15; 714/738

(58) Field of Classification Search .............. 716/1–7, 716/11, 18; 714/26, 738; 703/13–15, 19, 703/20; 365/145, 189.05; 341/51
See application file for complete search history.

(56) References Cited

U.S. PATENT DOCUMENTS

| | | | |
|---|---|---|---|
| 4,758,953 A | 7/1988 | Morita et al. | |
| 5,095,441 A | 3/1992 | Hopper et al. | |
| 5,249,133 A | 9/1993 | Batra | |
| 5,452,239 A * | 9/1995 | Dai et al. | 703/19 |
| 5,553,272 A * | 9/1996 | Ranganathan et al. | 716/11 |
| 5,870,588 A * | 2/1999 | Rompaey et al. | 703/13 |
| 5,896,301 A * | 4/1999 | Barrientos | 716/8 |
| 5,898,595 A * | 4/1999 | Bair et al. | 716/2 |
| 5,910,899 A * | 6/1999 | Barrientos | 716/8 |
| 6,011,911 A * | 1/2000 | Ho et al. | 716/5 |
| 6,023,567 A * | 2/2000 | Osler et al. | 716/6 |
| 6,078,736 A | 6/2000 | Guccione | |
| 6,131,080 A * | 10/2000 | Raimi et al. | 703/14 |
| 6,135,647 A | 10/2000 | Balakrishnan et al. | |
| 6,154,719 A * | 11/2000 | Saitoh et al. | 703/13 |
| 6,230,299 B1 * | 5/2001 | McSherry et al. | 716/1 |
| 6,272,671 B1 * | 8/2001 | Fakhry | 716/18 |
| 6,530,071 B1 | 3/2003 | Guccione et al. | |
| 6,530,072 B1 * | 3/2003 | Hagerman et al. | 716/18 |
| 6,546,532 B1 * | 4/2003 | Kerzman et al. | 716/8 |

(Continued)

OTHER PUBLICATIONS

Tanaka et al., "High speed string edit methods using hierarchical files and hashing technique", Nov. 14-17, 1988, Pattern Recognition, 1988., 9th International Conference on, pp. 334-336 vol. 1.*

(Continued)

*Primary Examiner*—Helen Rossoshek
(74) *Attorney, Agent, or Firm*—LeRoy D. Maunu (57) ABSTRACT

Methods are provided for processing design information of an electronic circuit design. A single path or multiple paths that are produced by a first design tool are an input for the method. Each path includes an ordered set of element names of the electronic circuit design. Each element name of each path is pattern matched with the names of design blocks of the electronic circuit design produced by a second design tool. Data indicative of a path produced by the second design tool that includes the design blocks that are pattern matched to the ordered set of element names is the output of the method.

16 Claims, 5 Drawing Sheets

U.S. PATENT DOCUMENTS

| | | | |
|---|---|---|---|
| 6,557,156 B1 | | 4/2003 | Guccione |
| 6,622,291 B1 * | | 9/2003 | Ginetti ............................ 716/9 |
| 6,678,646 B1 | | 1/2004 | McConnell et al. |
| 6,691,301 B2 * | | 2/2004 | Bowen ........................ 717/114 |
| 6,725,441 B1 | | 4/2004 | Keller et al. |
| 6,756,922 B2 * | | 6/2004 | Ossia ............................ 341/51 |
| 6,829,753 B2 * | | 12/2004 | Lee et al. ........................ 716/5 |
| 6,865,726 B1 * | | 3/2005 | Igusa et al. .................... 716/18 |
| 6,868,017 B2 * | | 3/2005 | Ikeda ..................... 365/189.05 |
| 6,868,532 B2 * | | 3/2005 | Nadeau-Dostie et al. ........ 716/4 |
| 6,922,665 B1 | | 7/2005 | Guccione et al. |
| 6,988,238 B1 * | | 1/2006 | Kovacevic et al. ........... 714/799 |
| 6,993,733 B2 * | | 1/2006 | Murphy ........................... 716/4 |
| 7,003,751 B1 * | | 2/2006 | Stroomer et al. ............... 716/11 |
| 7,006,960 B2 * | | 2/2006 | Schaumont et al. ........... 703/15 |
| 7,024,654 B2 | | 4/2006 | Bersch et al. |
| 7,062,418 B2 * | | 6/2006 | Lee et al. ........................ 703/2 |
| 7,073,152 B2 | | 7/2006 | Keller et al. |
| 7,139,955 B2 * | | 11/2006 | Rohrbaugh et al. .......... 714/738 |
| 7,143,367 B2 * | | 11/2006 | Eng ................................ 716/2 |
| 7,146,300 B2 * | | 12/2006 | Zammit et al. ................. 703/13 |
| 7,146,583 B1 * | | 12/2006 | Sun et al. ........................ 716/3 |
| 7,194,714 B2 * | | 3/2007 | Kartschoke et al. ............. 716/6 |
| 7,203,632 B2 * | | 4/2007 | Milne et al. .................... 703/14 |
| 7,216,321 B2 | | 5/2007 | Murphy et al. |
| 2001/0007139 A1 * | | 7/2001 | Murray ........................ 714/26 |
| 2002/0049958 A1 * | | 4/2002 | Shimazawa .................. 716/18 |
| 2002/0059054 A1 * | | 5/2002 | Bade et al. .................... 703/20 |
| 2003/0084416 A1 * | | 5/2003 | Dai et al. ........................ 716/7 |
| 2003/0216901 A1 * | | 11/2003 | Schaumont et al. ........... 703/13 |
| 2004/0015613 A1 * | | 1/2004 | Ikeda ............................. 710/1 |
| 2004/0141354 A1 * | | 7/2004 | Carnahan .................... 365/145 |
| 2005/0063481 A1 * | | 3/2005 | Fechtel et al. ............... 375/260 |
| 2005/0188339 A1 | | 8/2005 | Anderson |
| 2005/0210383 A1 * | | 9/2005 | Cucerzan et al. ............ 715/533 |
| 2005/0268258 A1 * | | 12/2005 | Decker ........................... 716/4 |
| 2005/0268269 A1 * | | 12/2005 | Coiley ........................... 716/11 |
| 2006/0059134 A1 * | | 3/2006 | Palmon et al. .................. 707/3 |
| 2006/0090146 A1 * | | 4/2006 | LeBritton et al. ............... 716/4 |
| 2006/0136193 A1 * | | 6/2006 | Lux-Pogodalla et al. ........ 704/2 |
| 2006/0200788 A1 | | 9/2006 | Nation et al. |
| 2008/0077377 A1 * | | 3/2008 | Roesner et al. ................ 703/13 |

OTHER PUBLICATIONS

Gonzalo Navarro, "Pattern Matching," Department of Computer Science University of Chile, pp. 1-24, Mar. 7, 2005, available from the Internet at http://www.ciw.cl/publicaciones/jstat04.pdf.

Michael Gilleland, "Levenshtein Distance In Three Flavors", pp. 1-12, available from http://www.merriampark.com/ld.htm, Mar. 18, 2005.

Bhattacharyya Shuvra Shikhar; "Compiling Dataflow Programs For Digital Signal Processing"; Jul. 1994; available from Department of Electrical Engineering and Computer Sciences, University of California at Berkeley, Berkeley, CA 94720; pp. 1-250.

Hsu, Chia-Jui et al.; "DIF: An Interchange Format For Dataflow-based Design Tools"; International Workshop on Systems, Architectures, Modeling and Simulation; Jul. 2004; available from Department of Electrical and Computer Engineering and Institute for Advanced Computer Studies, University of Maryland, College Park, 20742; pp. 1-10.

Lee, Edward A. et al.; "Dataflow Process Networks"; May 1995; IEEE, vol. 83, No.5; available from IEEE, 3 Park Avenue, 17th Floor, New York, NY 10016-5997; pp. 773-799.

J. Eker et al.; "CAL Language Report—Specification of the CAL actor Language"; Version 1.0, document edition 1; ERL Technical Memo UCB/ERL, M03/48; University of California at Berkeley; Dec. 1, 2003; pp. 1-112.

Massimo Ravasi et al.; "High-Level Algorithmic Complexity Evaluation for System Design"; Journal of Systems Architecture; Feb. 2003; Copyright 2003 Elsevier Science B.V.; available at www.ComputerScienceWeb.com; pp. 403-427.

Xilinx, Inc.; "Two Flows for Partial Reconfiguration: Module Based or Difference Based"; XAPP290 (v1.2); Sep. 9, 2004; available from www.xilinx.com; pp. 1-28.

Xilinx, Inc.; U.S. Appl. No. 11/373,745 by Janneck et al. filed Mar. 10, 2006.

Xilinx, Inc.; U.S. Appl. No. 11/373,744 by Janneck et al. filed Mar. 10, 2006.

Xilinx, Inc.; U.S. Appl. No. 11/243,679 by Janneck et al. filed Mar. 10, 2005.

Xilinx, Inc.; U.S. Appl. No. 11/373,709 by Schumacher et al. filed Oct. 4, 2005 by Xilinx, Inc.

Xilinx, Inc.; U.S. Appl. No. 11/243,732 by Vogenthaler filed Oct. 4, 2005.

* cited by examiner

CORRELATION OF DATA FROM DESIGN ANALYSIS TOOLS WITH DESIGN BLOCKS IN A HIGH-LEVEL MODELING SYSTEM

FIELD OF THE INVENTION

The present invention generally relates to electronic design tools.

BACKGROUND

A high-level modeling system (HLMS) allows a user to assemble, simulate, and debug an electronic circuit design. Some HLMS', such as the System Generator HLMS from Xilinx, also allow the design to be translated into a hardware description language (HDL).

An electronic circuit design in an HLMS is generally assembled with design blocks. Each block performs a desired function in the design, and the blocks are connected to accomplish the overall function of the design. For user convenience in assembling and manipulating the design, the blocks may be hierarchically arranged or nested such that a block may include one or more sub-blocks.

Additional tools are used in transforming the high-level design into a form that is realizable in hardware. These tools provide functions of technology mapping, component placement, and signal routing. In many instances, these tools change the names of the components or elements in the design, which makes analysis challenging if the user is used to working with high-level designs.

A low-level design may be analyzed to determine whether certain objectives, such as timing constraints, have been achieved. However, the user of an HLMS may be unable to easily inspect and understand the information produced by the low-level analyzers. The difficulties arise because a low-level analyzer expresses the output information using the names it received as input or as may have been modified by the analyzer. Since the names presented by the low-level analyzer may be different from the names in the high-level modeling system, it may be difficult to make use of the analyzer output for a designer accustomed to working at the high-level provided by the HLMS.

The present invention may address one or more of the above issues.

SUMMARY OF THE INVENTION

Various embodiments of the invention provide a method for processing design information of an electronic circuit design. A single path or multiple paths that are produced by a first design tool are an input for the method. Each path includes an ordered set of element names of the electronic circuit design. Each element name of each path is pattern matched with the names of design blocks of the electronic circuit design produced by a second design tool. Data indicative of a path produced by the second design tool that includes the design blocks that are pattern matched to the ordered set of element names is the output of the method.

In another embodiment, a plurality of paths produced by a first design tool are input. Each path includes an ordered set of element names of the electronic circuit design. For each path, each element name of the path is pattern matched with names of design blocks of the electronic circuit design produced by a second design tool. Each path is associated in a memory with a set of names of design blocks pattern matched to the path.

An apparatus for processing design information of an electronic circuit design is provided in another embodiment. The apparatus includes means for inputting a plurality of paths produced by a first design tool, wherein each path includes an ordered set of element names of the electronic circuit design; means, for each path, for pattern matching each element name of the path with names of design blocks of the electronic circuit design produced by a second design tool; and means for associating each path with a set of names of design blocks pattern matched to the path.

It will be appreciated that various other embodiments are set forth in the Detailed Description and Claims which follow.

BRIEF DESCRIPTION OF THE DRAWINGS

Various aspects and advantages of the invention will become apparent upon review of the following detailed description and upon reference to the drawings in which.

DETAILED DESCRIPTION

In various example embodiments of the invention, low-level analysis data for an electronic circuit design is correlated with high-level design blocks of an HLMS and the correlated low-level analysis data is back-annotated into the HLMS. The low-level analysis data may result from an analysis tool that analyzes a low-level design for the electronic circuit design that is produced from the high-level design blocks in the HLMS. The correlation may use pattern matching to correlate low-level names from the low-level analysis data with the names of the design blocks.

Figure 1:
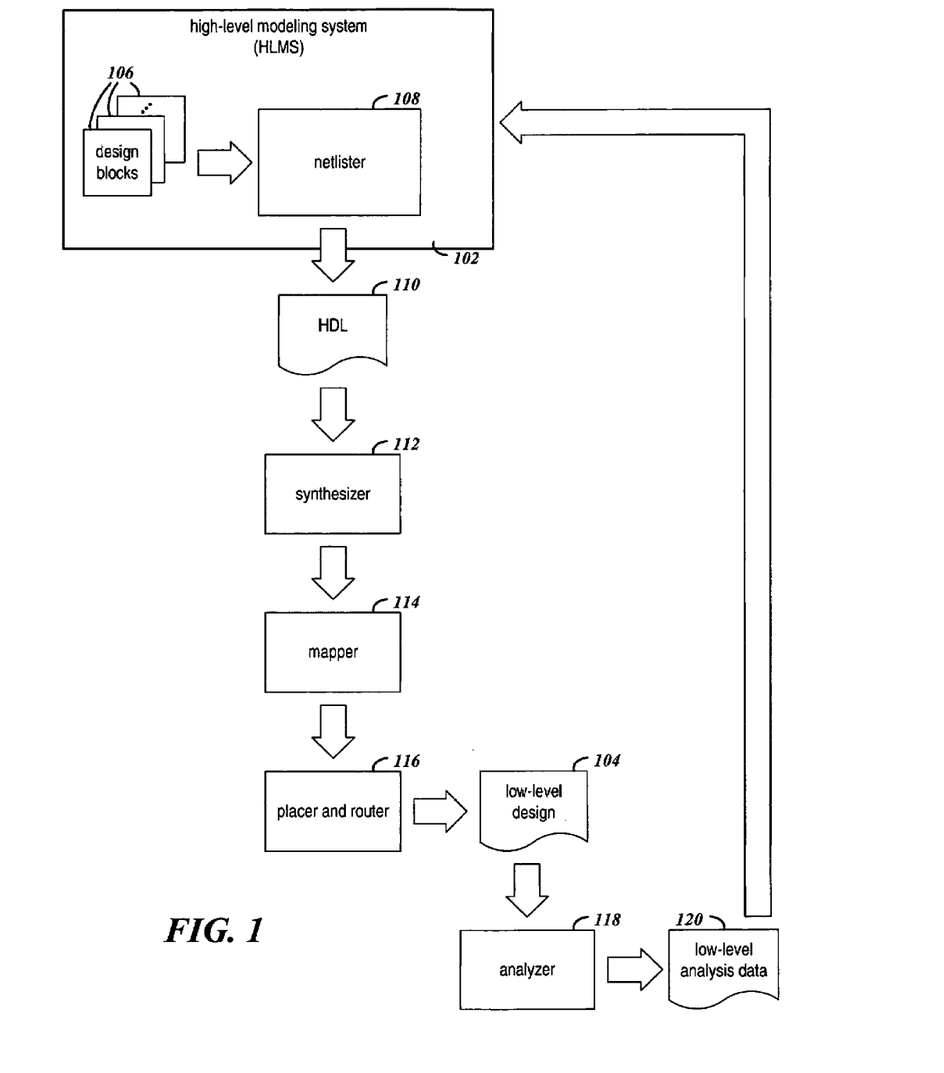
FIG. 1 is a flow diagram that shows the transformation of a high-level design in a high-level modeling system to a low-level design in accordance with various embodiments of the invention.

FIG. 1 is a flow diagram that shows the transformation of a high-level design in a high-level modeling system 102 to a low-level design 104. The design information for the high-level design of an electronic circuit design may be created in the HLMS 102 by a user selecting and connecting various design blocks 106.

A netlister 108 may transform the high-level design of design blocks 106 into a hardware description language 110 (HDL) representation of the high-level design. The HDL 110 may be processed by a sequence of tools including a synthesizer 112, a mapper 114, and a placer and router 116 to produce the low-level design 104. Typically, the low-level design 104 extends the hierarchy present in the high-level design by mapping each design block 106 into a collection of interconnected primitives, such as AND gates, OR gates, and look-up tables.

An analyzer 118 may determine certain characteristics of the low-level design 104 and report these characteristics as the low-level analysis data 120. An example analyzer 118 is a static timing analyzer that generates low-level analysis data 120, including, for example, the longest timing paths of the low-level design 104. Typically, the timing paths generated by a static timing analyzer are sorted by the length of the propagation delay for each path with the timing path having the longest propagation delay appearing first in the low-level analysis data 120. For example, the longest timing paths may be reported in low-level analysis data 120 as a sorted listing of any timing paths having a propagation delay greater than a targeted period of a clock signal of the electronic circuit design.

A sorted listing of longest timing paths that includes timing paths with propagation delays greater than a targeted clock period reports the timing paths that may prevent achievement of the targeted clock period. The timing paths presented first in this listing of longest timing paths represent the timing paths which most seriously prevent operation at the targeted clock period. Judicious rearrangement of the high-level design blocks 106 may be required to fix the timing paths with lengths that exceed the targeted clock period. In addition to re-arranging the blocks in a design, timing may also be improved by re-configuring the internals of individual blocks. If, for example, the critical timing path goes through a multiplier block, it may be possible to improve timing by configuring the multiplier to be implemented with special hardware present in the device, such as an embedded multiplier, rather than synthesizing the multiplier in the fabric of the device.

Each timing path in a listing of longest timing paths of low-level analysis data 120 may be specified by the sequence of primitives of low-level design 104 along the timing path. Each primitive on a timing path may be specified by a hierarchical name for the primitive. The hierarchical name may include the block names of the ancestors of the primitive in the design hierarchy and the name of the primitive separated by slash characters, for example.

Each timing path may be further specified by including the input port and the output port of each block and primitive along the timing path. For example, each timing path may be specified by the hierarchical name for each input port of a block or primitive along the timing path and each output port of a block or primitive along the timing path. A primitive's input port may be specified by the block names of the primitive and the primitive's ancestors in the design hierarchy and the name of the input port separated by slash characters. A primitive's output port and a block's input and output ports may be correspondingly specified.

Fixing timing paths in the HLMS 102 with a propagation delay that exceeds the targeted clock period may be time-consuming because the correlation of the names of the primitives of the low-level design 104 to the design blocks 106 may be difficult.

The correlation of the names of primitives of the low-level design 104 to the design blocks 106 may be difficult because of name changes and the low-level implementation details for the design blocks 106. For example, a design block 106 named "2D_Lowpass" in Xilinx's System Generator HLMS may be altered by HDL synthesizer 112, mapper 114, place-and-route tool 116 into "__2d_lowpass_" in low-level design 104. Block "__$_{2d}$_lowpass_" in low-level design 104 may be implemented using two primitives "AND3" and "OR2" and a timing path may be specified in low-level analysis data 120 as passing through block input "__2d_lowpass_/FILT_IN," primitive input "__2d_lowpass_/AND3/IN_B," primitive output "__2d_lowpass_/AND3/OUT," primitive input "__2d_lowpass_/OR2/IN_A," primitive output "__2d_lowpass_/OR2/OUT," and block output "__2d_lowpass_/FILT_OUT". It may be difficult for a user of HLMS 102 to discern that a timing path through these inputs and outputs of block "__$_{2d}$_lowpass_" and primitives "__2d_lowpass_/AND3" and "__2d_lowpass_/OR2" is a timing path through a design block 106 named "2D_Lowpass".

Various embodiments of the invention back-annotate low-level analysis data 120 into HLMS 102. Back-annotation of low-level analysis data 120 into HLMS 102 uses the correlation of names from the low-level analysis data 120 into corresponding names in the HLMS 102.

Figures 2, 3:
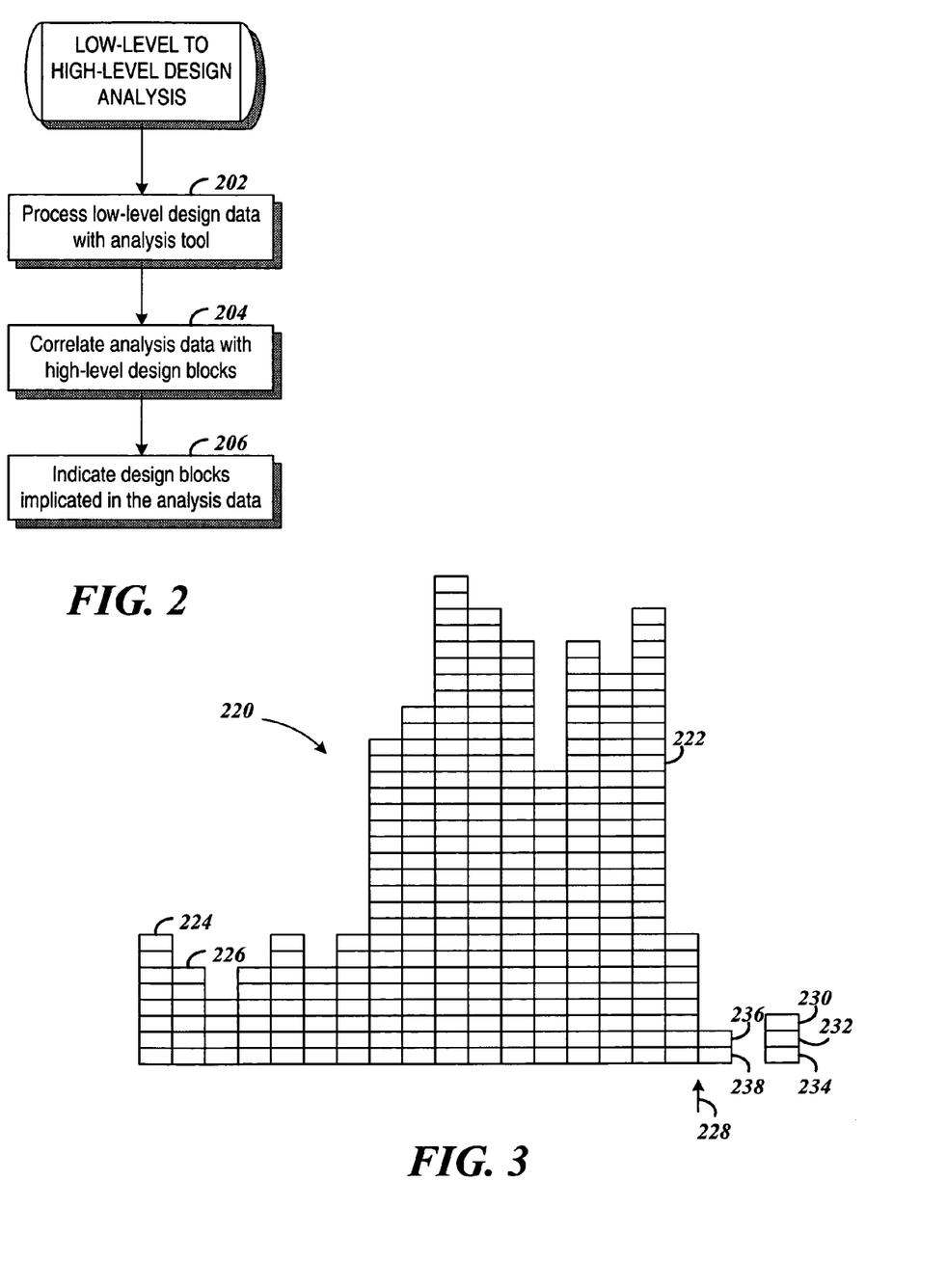
FIG. 2 is a flow diagram that shows an example process for analyzing a low-level design with correlation to high-level design blocks in accordance with various embodiments of the invention.
FIG. 3 is an example histogram of the paths of an example electronic circuit design in accordance with various embodiments of the invention.

FIG. 2 is a flow diagram that shows an example process for analyzing a low-level design with correlation to high-level design blocks. At step 202, the low-level design data is processed using an analysis tool, and the low-level analysis data is stored for further analysis. At step 204, the low-level analysis data is correlated with the high-level design blocks in a HLMS.

The correlation of step 204 may include a pattern matching step or multiple pattern matching steps. A pattern matching step correlates input names from the low-level analysis data into corresponding names of high-level design blocks in the HLMS. The pattern matching compensates for the modification of names by the various tools that translate the electronic circuit design from a high-level design to a low-level design by finding a best pattern match between each name in the low-level analysis data and the names in the HLMS.

At step 206, the design blocks implicated in the analysis data are indicated in the HLMS. In one embodiment, a listing of paths is presented to a user of a HLMS and the user may select one of the paths and the design blocks and connections corresponding to the selected path are highlighted in a graphical user interface of the HLMS.

The listing of paths may be presented to the user in one or more of several views which may be selectable by the user. In one view, for example, the paths are presented using the low-level names from the low-level analysis data. In another view, the paths are presented using the corresponding high-level names from the correlation of step 204. In yet another view, each path is presented on a histogram as a box placed in a column for a range of lengths corresponding to the range including the length of the path. For each view the length of the path may additionally be indicated. It will be appreciated that the length of the path may be relatively quantified, such as presenting the length of a propagation delay for a path as the difference between the propagation delay for the path and a targeted clock period.

FIG. 3 is an example histogram 220 of the paths of an example electronic circuit design. Each box, such as box 222, corresponds to a path of the electronic circuit design. A histogram 220 may have, for example, twenty columns, each column corresponding to a five percent range of the length of a path relative to the length of the longest path. For example, column 224 includes boxes for paths with a length between zero and five percent of the longest path and column 226 includes boxes for paths with a length between five and ten percent of the longest path. Boxes 230, 232, and 234 correspond to paths with a length from ninety-five to one-hundred percent of the length of the longest path. The example histogram also shows that no paths have a length between ninety and ninety-five percent of the longest path.

The shape of the histogram may indicate the user effort necessary to fix an electronic circuit design with timing paths having propagation delays that exceed the targeted clock period 228. For example, if only a few timing paths have corresponding boxes 230, 232, 234, 236, and 238 exceeding the targeted clock period 228 then fixing these timing paths may be straightforward. Alternatively, if there are many timing paths in the histogram exceeding the targeted clock period then fixing these timing paths may be difficult, especially when most of these timing paths do not include any shared sub-paths.

Generally, a listing of paths is presented sorted by the length of the paths and selecting an item from the listing of paths causes the path to be graphically indicated in the HLMS. For example, the boxes for the paths in the columns of the histogram may be vertically sorted within each column and the selection of the item of a box may cause the path for the box to be graphically indicated in the HLMS. For example, box 230 may correspond to the longest timing path and the next longest paths in order of decreasing length may be the paths corresponding to boxes 232, 234, 236, and 238.

Figure 4:
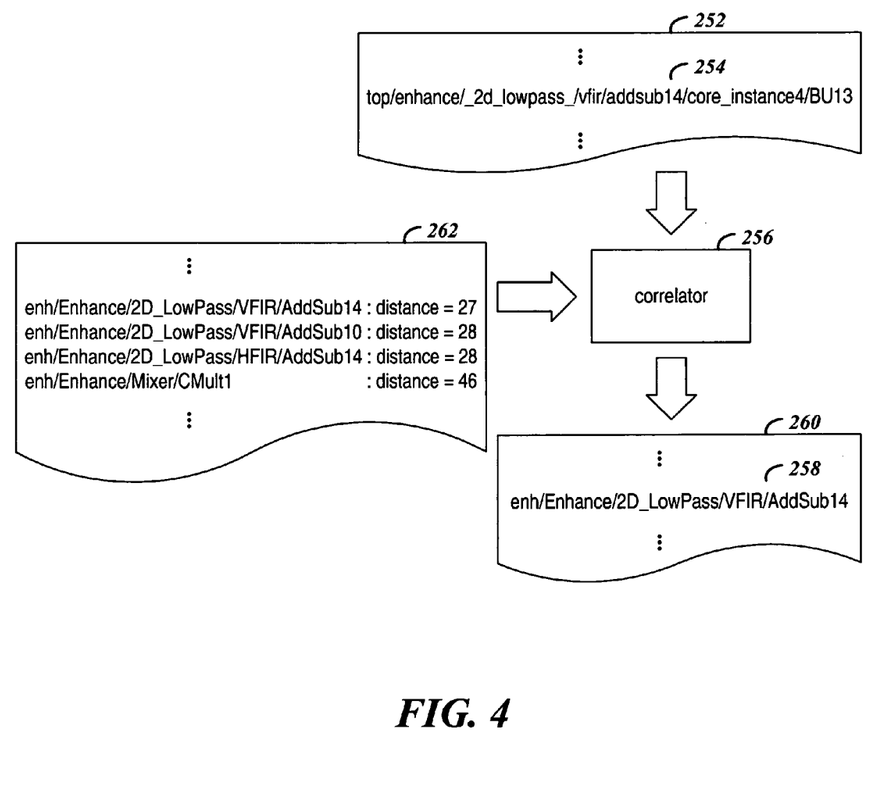
FIG. 4 illustrates example analysis data from an analyzer and the correlation with high-level design blocks in accordance with various embodiments of the invention.

FIG. 4 illustrates example analysis data from an analyzer and the correlation with high-level design blocks. The low-level analysis data may include one or more paths 252. In one embodiment, low-level path 252 may be represented by the sequence of primitives of the low-level design along the path. Low-level path 252 shows one primitive 254 along the path 252. In another embodiment, a low-level path maybe represented by the sequence of ports, including input and output ports, of primitives and blocks along the path.

Correlator 256 may translate primitive 254 of low-level path 252 into design block 258 of high-level path 260. Correlator 256 may similarly translate the other primitives of low-level path 252 into corresponding design blocks of high-level path 260. A primitive 254 may be correlated by correlator 256 using the design blocks 262 for the electronic circuit design. For each primitive, such as 254, of each path 252, the correlator 256 may determine the correlation between the primitive and each of the design blocks 262.

For purposes of illustration, each of design blocks 262 includes a correlation distance between the primitive 254 and the design block. For example, the correlation distance between primitive 254 and design block "enh/Enhance/2D_LowpassNFIR/AddSub14" is a correlation distance of 27. For each primitive, such as 254, of each path 252, the correlator 256 selects the design block of design blocks 262 having a best correlation distance. Thus, the design block of design blocks 262 corresponding to primitive 254 is design block 258.

Each correlation distance may be the result of a pattern matching between the primitive 254 and each of the design blocks 262. Generally, the correlation distance quantifies the similarity between a primitive, such as 254, and a design block of design blocks 262. Example pattern matching approaches for a correlator 256 to generate a correlation distance include edit distance, longest-common-substring, and regular expression methods.

Edit distance methods may count the number of character additions, deletions, and substitutions necessary to convert a character string for a name of a primitive, such as 254, into a character string for a name of a design block of design block 262, or vice versa. Example edit distance methods include the Levenshtein edit distance method and the Damerau edit distance method. A pattern matching approach may stipulate that a difference between a lower-case and a similar upper-case character does not contribute to the edit distance. Each design block of design blocks 262 can include the Levenshtein edit distance between the design block and the primitive 254. The Levenshtein edit distance method and/or the Damerau edit distance method are used in some embodiments of the invention. In other embodiments, other pattern matching routines having other similarity (or dissimilarity) measurements, including pattern matching routines having other edit distance measurements, as known to one of ordinary skill in the art, may be used. Some examples are described in the article "Pattern Matching" by Gonzalo Navarro of the Department of Computer Science University of Chile.

Various tools, such as a synthesizer, a mapper, and a place-and-route tool, may modify the names of high-level blocks to generate the low-level design. Further, these tools may modify the names of high-level blocks in an unspecified manner and/or in a manner that may vary between versions of these tools. In addition, the low-level design may include additional design details. Using a correlator 256 allows low-level analysis data for an electronic circuit design to be translated into high-level analysis data while tolerating name changes and additional design details. It will be appreciated that a path in the low-level analysis data may pass through several primitives within the low-level implementation of a particular design block, and repetitions of this particular design block may be omitted in high-level path 260.

The correlator 256 may use one pattern matching step or multiple pattern matching steps. A particular design tool, such as the mapper, may modify design block names in a known manner or may specify the modification of design block names by outputting a table of generated names, for example. In one embodiment, the correlator 256 may break the correlation process into three steps: a first pattern matching step compensating for any name modifications by design tools before the mapper in the design tool flow, a name lookup in the table of generated names for the mapper, and a second pattern matching step compensating for any name modification by design tools after the mapper. By using the actual name modification of tools that specify the modification of names and pattern matching of intermediate names for tools that do not specify the modification of names, improved correlation of names may be obtained.

Users of an HLMS produce and understand an electronic system design in a graphical context. Timing reports of low-level analysis data are typically presented as text listing low-level paths. The correlation of the textual timing paths to a graphical presentation in a graphical user interface of a HLMS allows a user of the HLMS to examine the timing paths in an environment matching the graphical context used to produce and understand the electronic system design.

Figure 5:
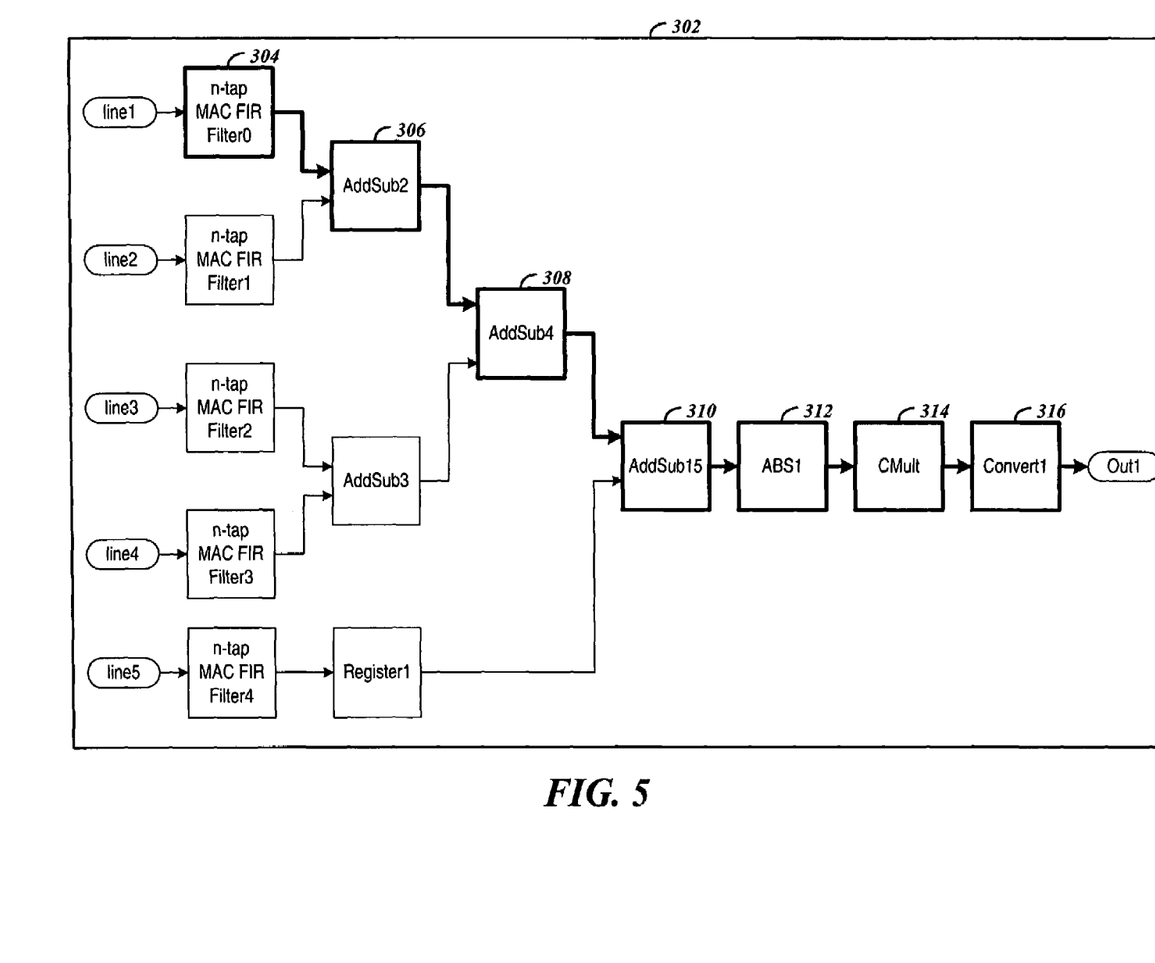
FIG. 5 is a block diagram in an HLMS of high-level design blocks with a path highlighted in accordance with various embodiments of the invention.

FIG. 5 is a block diagram in an HLMS 302 of high-level design blocks with a path highlighted. The highlighted path begins at design block 304, passes through design blocks 306, 308, 310, 312, 314, and ends at design block 316. The connections between these blocks along the path may also be highlighted. It will be appreciated that the highlighting of connections between blocks on a path may require correlation of low-level and high-level names that each includes port names. The highlighting of this path may result from a user of HLMS 302 selecting a path from a listing of paths, such as a listing of the longest timing paths for the electronic circuit design.

The highlighted path in the example shows relatively thicker block lines and connection lines than the other blocks and connection lines. It will be appreciated that other highlighting characteristics may be used such as line colors, line shading, background colors, broken lines, text colors, text size, text font, flashing lines and or text, or various combinations thereof.

Figure 6:
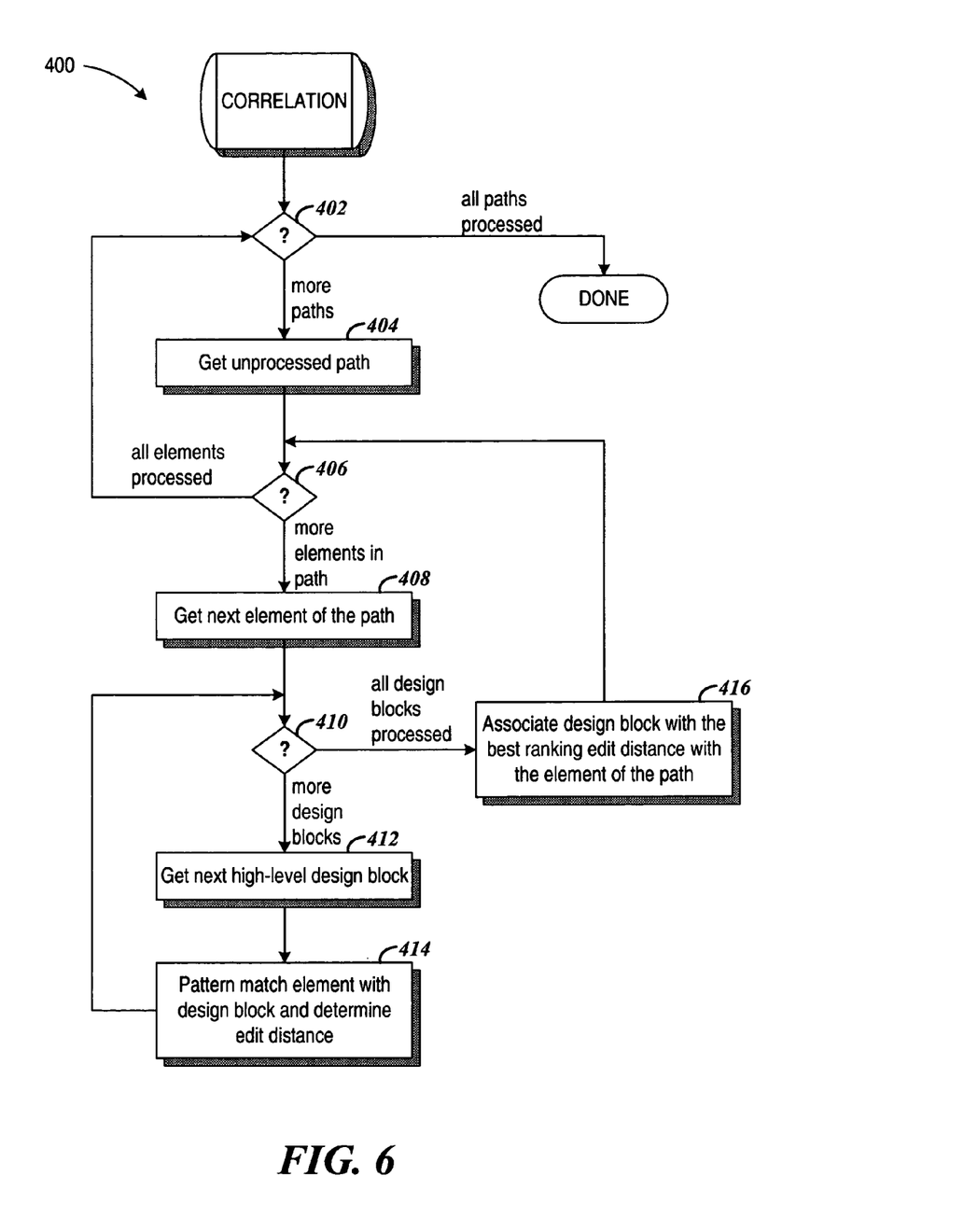
FIG. 6 is a flow diagram that shows a process for correlating low-level analysis data with high-level design blocks in accordance with various embodiments of the invention.

FIG. 6 is a flow diagram that shows a process 400 for correlating low-level analysis data with high-level design blocks. Each primitive, and possibly each port of a primitive or block for certain embodiments, of each path from the low-level analysis data is correlated with each high-level design block to translate each path from the low-level analysis data into a high-level path.

Decision 402 checks whether more paths from the low-level analysis are to be processed. If there are more paths to be processed then process 400 proceeds to step 404 and otherwise process 400 is complete. At step 404, an unprocessed path is obtained from the low-level analysis data. Decision 406 checks whether more elements of the current path are to be correlated with the design blocks. If there are more elements to be correlated then process 400 proceeds to step 408 and otherwise process 400 returns to decision 402. At step 408, the next element of the current path is obtained from the low-level analysis data.

Decision 410 checks whether more high-level design blocks are to be correlated with the current element of the current path. If there are more design blocks to be correlated with the current element of the current path, process 400 proceeds to step 412 and otherwise process 400 proceeds to step 416. At step 412, the next design block to be correlated is obtained from the HLMS. At step 414, pattern matching is used to determine an edit distance between the current element of the current path and the current design block. The edit distance may quantify the similarity between the element and the design block.

At step 416, after all design blocks have been correlated with the current element of the current path, the design block with the best ranking edit distance is associated with the current element of the current path. Thus, after every element of every path has been correlated to a corresponding design block, the low-level paths of the low-level analysis data have been translated into high-level paths.

It will be appreciated that a quickly evaluated heuristic may be used to eliminate the pattern matching in step 414 for certain design blocks. Thus, the efficiency of correlation process 400 may be improved.

In one heuristic, calculating the edit-distance between a path element and a block in the HLMS may be skipped when the number of levels of hierarchy for the path element is less than the number of levels of hierarchy for the block in the HLMS. As the high-level design is transformed by various tools into the low-level design, design components generally accumulate additional levels of hierarchy and never lose levels of hierarchy. Thus, a path element cannot match up against any block in the HLMS that has more levels of hierarchy than the path element. For example, a path element "top_level/subsystem/adder/AND" with 4 levels of hierarchy has no relationship to a block "Top Level/subsystem1/subsystem2/subsystem3/adder" with 5 levels of hierarchy, thus calculating the edit distance between this path element and this block may be skipped.

In another heuristic, calculation of the edit distance between a path element and a block may be terminated early when a partial result for the edit distance calculation exceeds a previously calculated edit distance between the path element and another block. For example, consider edit distance calculations between path element P and design blocks A and B. If the edit distance calculation between path element P and design block A resulted in an edit-distance of 50, and a partially completed edit distance calculation between path element P and design block B indicates that this edit distance is at least 51, then the edit distance calculation between path element P and design block B may be terminated.

Those skilled in the art will appreciate that various alternative computing arrangements, including one or more processors and a memory arrangement configured with program code, would be suitable for hosting the processes and data structures of the different embodiments of the present invention. In addition, the processes may be provided via a variety of computer-readable media or delivery channels such as magnetic or optical disks or tapes, electronic storage devices, or as application services over a network.

The present invention is thought to be applicable to a variety of systems for analyzing electronic circuit designs. Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. A processor-implemented method for processing design information of an electronic circuit design, comprising:
    inputting a path produced by a first design tool, wherein the path includes an ordered set of element names of the electronic circuit design;
    pattern matching each element name of the path with names of design blocks of the electronic circuit design produced by a second design tool; and
    outputting data indicative of a path produced by the second design tool including the design blocks pattern matched to the ordered set of the element names,
    wherein the outputting includes highlighting the design blocks that are pattern matched in a graphical user interface of the second design tool, and
    wherein the pattern matching includes determining an edit distance between each element name of the path and the names of the design blocks and matching each element name of the path with one of the design blocks having the edit distance that is shortest.

2. The method of claim 1, wherein the edit distance is determined using one of a Levenshtein method, a Damerau method, a longest-common-substring method, and a regular expression method.

3. The method of claim 2, further comprising disregarding differences in character case in determining an edit distance.

4. The method of claim 1, wherein the outputting further includes highlighting in the graphical user interface connections between the design blocks that pattern match adjacent element names in the ordered set of the path.

5. The method of claim 1, wherein the first design tool is a timing analysis tool and the path is a timing path of the electronic circuit design.

6. The method of claim 1, wherein the pattern matching includes pattern matching each element name of the path with first intermediate names, mapping each of the first intermediate names to second intermediate names, and pattern matching each of the second intermediate names with the names of the design blocks.

7. A processor-implemented method for processing design information of an electronic circuit design, comprising:
    inputting a plurality of paths produced by a first design tool, wherein each path includes an ordered set of element names of the electronic circuit design;
    for each path, pattern matching each element name of the path with names of design blocks of the electronic circuit design produced by a second design tool;
    associating in a memory each path with a set of names of design blocks pattern matched to the path;
    outputting a set of user-selectable items, each item indicative of a set of names of design blocks pattern matched to a path; and
    highlighting, in response to selection of one of the user-selectable items icons representing the design blocks indicated by the selected item in a graphical user interface of the second design tool, wherein the pattern matching each element name of the path includes determining an edit distance between each element name of the path and the names of the design blocks and matching each element name of the path with one of the design blocks having the edit distance that is shortest.

8. The method of claim 7, wherein the edit distance is determined using one or more of a Levenshtein method, a Damerau method, a longest-common-substring method, a regular expression method.

9. The method of claim 7 further comprising highlighting in the graphical user interface connections between the icons.

10. The method of claim 7, further comprising:
   outputting a set of user-selectable items, each item indicative of a set of names of design blocks pattern matched to a path; and
   outputting, in response to selection of one of the user-selectable items, the ordered set of element names of the path associated with the names of design blocks pattern matched to the path and indicated by the selected user-selectable item.

11. The method of claim 7, further comprising inputting a length value corresponding to each input path, and associating in the memory each path with the corresponding length value,
   wherein the length value for each input path quantifies a propagation delay for the corresponding input path.

12. The method of claim 11, wherein the first design tool is a timing analysis tool, each path is a timing path of the electronic circuit design, and the propagation delay for each path is the length value corresponding to the path.

13. The method of claim 11, further comprising outputting a set of user-selectable items, each item indicative of a set of names of design blocks pattern matched to a path, wherein the output set of items is ordered according to the length values of the paths associated with the indicated sets of names of design blocks.

14. The method of claim 11, further comprising outputting a histogram that indicates for each range of a plurality of ranges of the length value a respective number of the paths having length values in the range.

15. The method of claim 14, wherein the outputting further includes displaying the histogram in a graphical user interface of the second design tool.

16. An apparatus for processing design information of an electronic circuit design, comprising:
   means for inputting a plurality of paths produced by a first design tool, wherein each path includes an ordered set of element names of the electronic circuit design;
   means, for each path, for pattern matching each element name of the path with names of design blocks of the electronic circuit design produced by a second design tool;
   means for associating each path with a set of names of design blocks pattern matched to the path;
   means for outputting a set of user-selectable items, each item indicative of a set of names of design blocks pattern matched to a path; and
   means for highlighting in response to selection of one of the user-selectable items, icons representing the design blocks indicated by the selected item in a graphical user interface of the second design tool,
   wherein the pattern matching each element name of the path includes determining an edit distance between each element name of the path and the names of the design blocks and matching each element name of the path with one of the design blocks having the edit distance that is shortest.

* * * * *